(12) United States Patent
Omlor et al.

(10) Patent No.: US 11,821,860 B2
(45) Date of Patent: Nov. 21, 2023

(54) OPTICAL THREE-DIMENSIONAL SCANNING FOR COLLISION AVOIDANCE IN MICROSCOPY SYSTEM

(71) Applicant: Carl Zeiss X-ray Microscopy Inc., Pleasanton, CA (US)

(72) Inventors: Lars Omlor, Pleasanton, CA (US); Hauyee Chang, Pleasanton, CA (US)

(73) Assignee: CARL ZEISS X-RAY MICROSCOPY INC., Dublin, CA (US)

( * ) Notice: Subject to any disclaimer, the term of this patent is extended or adjusted under 35 U.S.C. 154(b) by 468 days.

(21) Appl. No.: 17/070,497

(22) Filed: Oct. 14, 2020

(65) Prior Publication Data
US 2021/0116401 A1    Apr. 22, 2021

Related U.S. Application Data

(60) Provisional application No. 62/915,706, filed on Oct. 16, 2019.

(51) Int. Cl.
| | | |
|---|---|---|
| *H01J 37/20* | (2006.01) | |
| *G01N 23/2252* | (2018.01) | |
| *G21K 7/00* | (2006.01) | |

(52) U.S. Cl.
CPC .......... *G01N 23/2252* (2013.01); *G21K 7/00* (2013.01); *H01J 37/20* (2013.01); *G01N 2223/1016* (2013.01); *G01N 2223/418* (2013.01)

(58) Field of Classification Search
CPC ............. G01N 23/2252; G01N 23/046; G01N 2223/1016; G01N 2223/418; G21K 7/00; G05B 19/4061; H01J 37/20

USPC .................................................... 250/442.11
See application file for complete search history.

(56) References Cited

U.S. PATENT DOCUMENTS

| | | | |
|---|---|---|---|
| 6,345,086 B1 * | 2/2002 | Ferrandino | .......... G01N 23/223 378/208 |
| 7,972,062 B2 | 7/2011 | Nicolosi et al. | |
| 10,753,887 B2 | 8/2020 | Ariga et al. | |
| 2012/0074317 A1 | 3/2012 | Diemer et al. | |
| 2019/0103245 A1 * | 4/2019 | Van Der Mast | ........ H01J 37/20 |

FOREIGN PATENT DOCUMENTS

WO    WO 2017150977 A1    9/2017

OTHER PUBLICATIONS

Bellet, J.-B., et al., "Reflective Filtered Backprojection: Numerical Results," 1-11 (2015).
Ijiri, T., et al., "Digitization of Natural Objects with Micro CT and Photographs," PLoS One, 13(4): 1-18 (2017).
Kratz, B., et al., "Fully Automatic Optical Surface Determination in Computed Tomography," 19th World Conference on Non-Destructive Testing 2016, 1-8 (2016).

(Continued)

*Primary Examiner* — Kiet T Nguyen
(74) *Attorney, Agent, or Firm* — HoustonHogle LLP

(57) ABSTRACT

A collision avoidance system and method for an x-ray CT microscope processes image data of an object at different angles and generates a model of the object. This model is then used to configure the microscope for operation and possibly avoid collisions between the microscope and the object.

20 Claims, 10 Drawing Sheets

(56) References Cited

OTHER PUBLICATIONS

Matusik, W., et al., "Image-Based 3D Photography Using Opacity Hulls," Proceedings of the 29th Annual Conference on Computer Graphics and Interactive Techniques, 427-437 (2002).
Quinto, E.T., "Singularities of the X-Ray Transform and Limited Data Tomography in R2 and R3*," Siam. J. Math. Anal., 24(5): 1215-1225 (1993).
Vianello, A., et al., "Robust Hough Transform Based 3D Reconstruction from Circular Light Fields," Proceedings of the IEEE Conference on Computer Vision and Pattern Recognition, 7327-7335 (2018).
European Search Report dated Mar. 24, 2021, from European Patent Application No. 20202080.6, filed on Oct. 15, 2020. 7 pages.
Moons et al., "3D Reconstruction from Multiple Images Part 1: Principles", Foundations and Trends® in Computer Graphics and Vision vol. 4, No. 4 (2008) © 2009 T. i\foon8, L. Van G0o1 and M. Vergauwen, DOI: 10.1561/0600000007, pp. 287-398.

\* cited by examiner

OPTICAL THREE-DIMENSIONAL SCANNING FOR COLLISION AVOIDANCE IN MICROSCOPY SYSTEM

RELATED APPLICATIONS

This application claims the benefit under 35 USC 119(e) of U.S. Provisional Application No. 62/915,706, filed on Oct. 16, 2019, which is incorporated herein by reference in its entirety.

BACKGROUND OF THE INVENTION

X-ray computed tomography (CT) is a non-destructive technique for inspecting and analyzing internal structures of objects. In general, x-rays are absorbed or scattered as the x-rays travel through the objects. The x-rays not absorbed or scattered away are then detected by a detector system. The image formed at the detector system is known as an x-ray projection. Tomographic volume data sets are then reconstructed from a series of these projections via standard CT reconstruction algorithms, as the objects are scanned at different angles.

There are a number of different configurations for x-ray CT systems. In x-ray microscopy systems, because the x-ray sources and detectors are large and the objects being scanned are typically small, the x-ray sources and detectors are largely fixed, while the objects are rotated in the x-ray beam. This contrasts with medical CT systems where the patient is fixed and the sources and detectors rotate around the patient.

SUMMARY OF THE INVENTION

In many cases, the objects scanned in X-ray microscopy systems have a priori unknown shapes. Even in the cases where a CAD model is available or the object is from a dimensionally-known core-sample, for example, the exact alignment of the object is often unknown. Moreover, the alignment may be changed when different regions of interest are selected and the object is realigned in the beam path. This leads to the problem that while the object is moved to be scanned (mostly rotated) the object might collide with the scanning setup (the parts of the X-ray-source or detector that are most proximate to the object). The challenge of avoiding collisions is often made more difficult by the fact that the X-ray source and/or the detector will need to be moved into close proximity to the object for optimal system performance.

Similar setups also exist in other microscopy/tomography systems operating in other regions of the electromagnetic spectrum such as optical coherence tomography and confocal microscopy (optical projection tomography). Still other examples include scanning electron microscopes (SEMs) and focused ion beam (FIB) systems—i.e. charged particle imaging systems.

Collisions can be avoided if a 3D model (e.g. a 3D representation such as a mesh or surface data) of the object and a 3D model of the setup is available. Another use of such a digital 3D model of the object is the prediction of the resulting X-ray images, through ray tracing. Such simulated images can be used for region of imaging selection, contrast enhancement, system configuration (e.g. source voltage or power) or fully automated scanning as well as an improved X-ray reconstruction.

In general, according to one aspect, the invention features a collision avoidance system for a microscope. This system comprises a camera or multiple cameras for capturing images of an object loaded into the microscope and a computer that processes image data of an object at different angles from the camera, generates a model of the object, and uses the model to configure the microscope for operation.

In embodiments, the computer uses the model to avoid collisions between the microscope and the object.

Also, the microscope might be an x-ray microscope, scanning electron microscope, a focused ion beam system, or an optical microscope, for example.

Preferably, the computer further has a model of a source subsystem and/or a detector subsystem, which are also used to configure the microscope. In addition, the computer receives current position data of a source subsystem and/or a detector subsystem in examples. Further, the computer might render a display including a model of the object.

In some embodiments, a light source is provided for illuminating the object under control of the computer. The light source might illuminate the object in different colors and/or a background of the object.

In general, according to another aspect, the invention features a collision avoidance method for a microscope. The method comprises capturing image data of an object at different angles, generating a model of the object, and using the model to configure the microscope for operation.

In general, according to another aspect, the invention features a user interface rendered on a display of a microscopy system. This interface comprises controls for moving a source stage and/or object stages and/or a detector stage and an image region in which a model of an object to be imaged is rendered.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
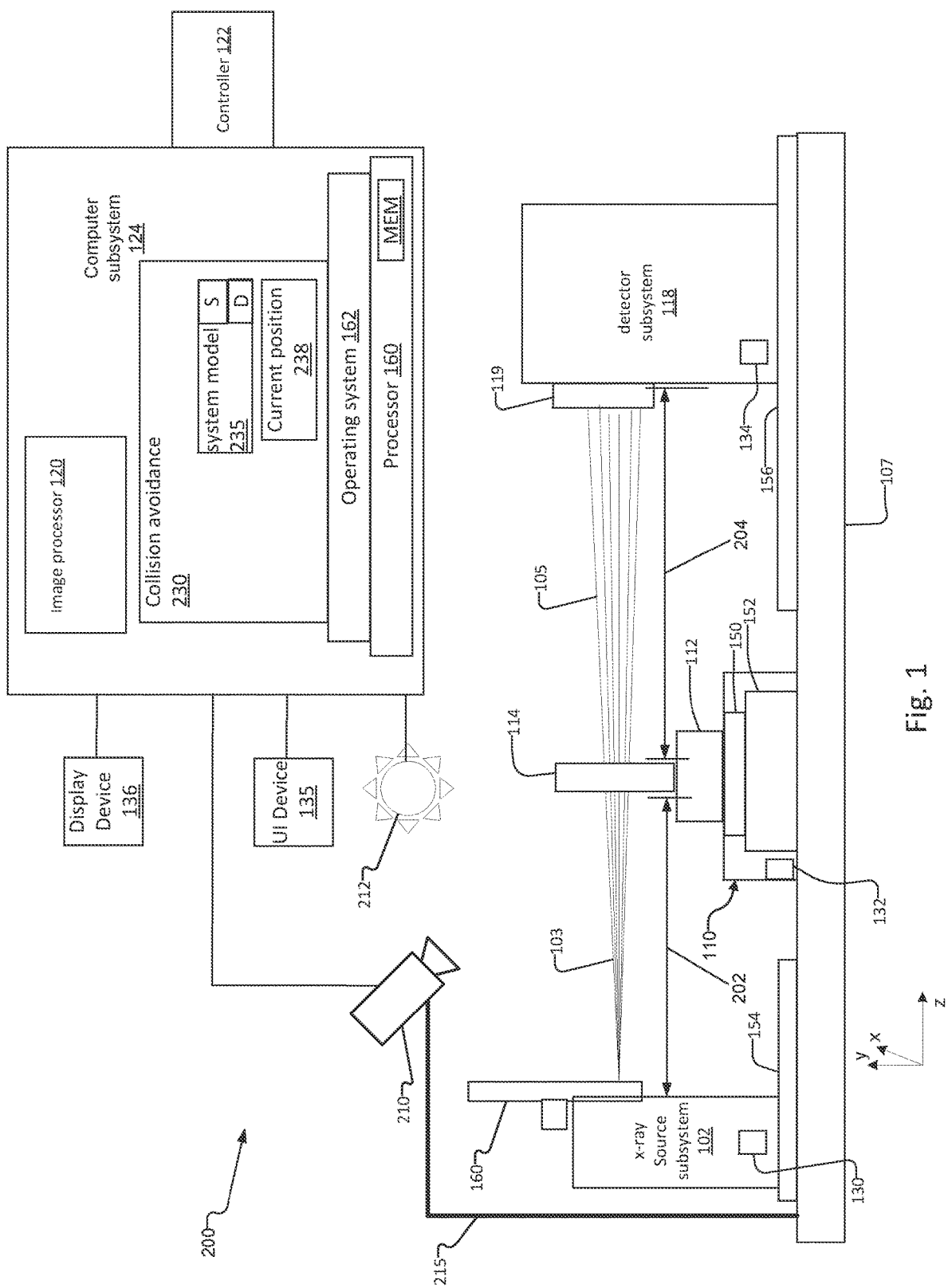
FIG. 1 is a schematic diagram of an x-ray microscopy system to which the present invention is applied in one embodiment.

FIG. 1 is a schematic diagram of a microscopy system 200 to which the present invention is applicable.

The illustrated microscopy system 200 is an X-ray CT system and generally includes several subsystems. An X-ray source subsystem 102 generates a polychromatic or possibly monochromatic X-ray beam 103. An object stage subsystem 110 with object holder 112 holds an object 114 in the beam and positions and repositions it to enable scanning of the object 114 in the stationary beam 103, 105. A detector subsystem 118 detects the beam 105 after it has been modulated by the object. A base, such as a platform or optics table 107, provides a stable foundation for the microscopy system 200 and its subsystems.

In general, the object stage subsystem 110 has the ability to position and rotate the object 114 in the beam 103. Thus, the object stage subsystem 110 will typically include linear and rotation stages. The illustrated example has a precision 3-axis stage 152 that translates and positions the object along the x, y, and z axes, very precisely but only over relatively small ranges of travel. This allows a region of interest of the object 114 to be located within the beam 103/105. The 3-axis stage 150 is mounted on a theta stage 152 that rotates the object 114 in the beam around the y-axis. The theta stage 152 is in turn mounted on the base 107.

The source subsystem 102 will typically be either a synchrotron x-ray radiation source or alternatively a "laboratory x-ray source" in some embodiments.

As used herein, a "laboratory x-ray source" is any suitable source of x-rays that is not a synchrotron x-ray radiation source. Laboratory x-ray source 102 can be an X-ray tube, in which electrons are accelerated in a vacuum by an electric field and shot into a target piece of metal, with x-rays being emitted as the electrons decelerate in the metal. Typically, such sources produce a continuous spectrum of background x-rays combined with sharp peaks in intensity at certain energies that derive from the characteristic lines of the selected target, depending on the type of metal target used. Furthermore, the x-ray beams are divergent and lack spatial and temporal coherence.

In one example, source subsystem 102 is a rotating anode type or microfocused source, with a Tungsten target. Targets that include Molybdenum, Gold, Platinum, Silver or Copper also can be employed. Preferably a transmission configuration is used in which the electron beam strikes the thin target from its backside. The x-rays emitted from the other side of the target are used as the beam 103.

The x-ray beam generated by source subsystem 102 is often conditioned to suppress unwanted energies or wavelengths of radiation. For example, undesired wavelengths present in the beam are eliminated or attenuated, using, for instance, energy filters (designed to select a desired x-ray energy range (bandwidth)) held in a filter wheel 160, Conditioning is also often provided by collimators or condensers.

For other types of microscopy systems, different sources would be used. For example, if the microscopy system 200 is a scanning electron microscope (SEM), the source subsystem 102 generates an electron beam. If the microscopy system is a focused ion beam (FIB) system, then the source subsystem 102 generates an ion beam. Finally, if the microscopy system operates in the optical regime, then the source subsystem 102 generates a beam of light.

When the object 114 is exposed to the X-ray or other beam 103, the X-ray photons or particles, which propagate through the object, form a modulated beam 105 that is received by the detector subsystem 118. In some other examples, an objective lens is used to form an image onto the detector subsystem 118 of the microscopy system 200.

Typically, a magnified projection image of the object 114 is formed on the detector subsystem 118. The magnification is equal to the inverse ratio of the source-to-object distance 202 and the source-to-detector distance 204.

To achieve high resolution, the X-ray CT system 200 utilizes a very high resolution detector subsystem 118 in conjunction possibly with positioning the object 114 close to the X-ray source subsystem 102. In this case, the resolution of the x-ray image is limited by the resolution of the detector subsystem 118, the focus spot size of the X-ray source subsystem 102, the position of the object 114 and the geometrical magnification of the object 114 at the detector subsystem 118. In other examples, the object might be positioned close to the detector subsystem, especially when the detector subsystem employs optical magnification.

For other types of microscopy systems, the appropriate detector (electron, particle, optical) is selected.

Typically, the source subsystem 102 and the detector subsystem 118 are mounted on respective z-axis stages. For example, in the illustrated example, the source subsystem 102 is mounted to the base 107 via a source stage 154, and the detector subsystem 118 is mounted to the base 107 via a detector stage 156. In practice, the source stage 154 and the detector stage 156 are lower precision, high travel-range stages that allow the source subsystem 102 and the detector subsystem 118 to be moved into position, often very close to the object during scanning and then be retracted to allow the object to be removed from, a new object to be loaded onto, and/or the object to be repositioned on the object holder 112 of the object stage subsystem 110.

The operation of the microscopy system 200 and the scanning of the object 114 is controlled by a computer subsystem 124 that often includes an image processor 120 and a controller 122.

The computer system 124 includes one or more processors 160 along with their data storage resources such as disc or solid-state drives, and memory MEM. The processors 160 execute an operating system 162 and various applications run on that operating system 162 to allow for user control and operation of the microscopy system 200. A display device 136 connected to the computer subsystem 124 displays information from the microscopy system 200 such as the tomographic reconstructions in the graphical user interface. User input device(s) 135 such as a touch screen, computer mouse, and/or keyboard enable interaction between the operator and the computer subsystem 124.

The controller 122 allows the computer subsystem 124 to control and manage components in the X-ray CT microscope 200 under software control. The controller might be a separate computer system adapted to handle realtime operations or an application program executing on the processor 160. The source subsystem 102 includes a control interface 130 allowing for its control and monitoring by the controller 122. Similarly, the object stage subsystem 110 and the detector subsystem 118 have respective control interfaces 132, 134 for allowing for their control and monitoring by the computer subsystem 124 via the controller 122.

To configure the microscopy system 200 to scan the object and to adjust other parameters such as the geometrical magnification, the operator utilizes the user interface rendered on the display device to adjust the source-to-object distance 202 and the source-to-detector distance 204 by respective operation of the source stage 154 and detector stage 156 to achieve the desired scanning setup.

Specifically, the source stage 154 and detector stage 156 include respective motor encoder systems or other actuator systems that allow the computer system 124 via the controller 122 to position the respective x-ray source subsystem 102 and the detector subsystem 118 to specified positions via the control interfaces 130, 134. Further, the source stage 154 and detector stage 156 signal the controller 122 of their actual positions.

The operator of the system under automatic control operates the object stage subsystem 110 to perform the CT scan via computer subsystem, the controller 122 and the control interfaces 130, 132, 134. Typically, the object stage subsystem 110 will position the object by rotating the object about an axis that is orthogonal to the optical axis of the x-ray beam 103, 105 by controlling the theta stage 152 and/or position the object in the x, y, z axes directions using stage 150.

The detector subsystem 118 creates an image representation of the photons or particles from the attenuated beam 105. Often, it includes a scintillator and an electronic spatially resolved electronic detector in the case of an X-ray system, for example. The image formed at the detector system 118 is also known as a projection or projection image.

Using the user interface rendered on the display device, the operator defines/selects scanning set up including the CT scan parameters. These include voltage settings that help to determine the X-ray energy spectrum and exposure time on the X-ray source subsystem 102. The operator also typically selects other settings such as the field of view of the X-ray beam 103 incident upon the object 114, the number of X-ray projection images to create for the object 114. Generally, the scanning setup includes the angles to rotate and position the object by the stage subsystem 110. In addition, the source-to-object distance 202 and the source-to-detector distance 204 are often specified and these are converted to the necessary positions or settings for the source stage 154 and detector stage 156 as part of the scanning setup.

The computer subsystem 124, with the possible assistance of its image processor 120, accepts the set of images from the detector subsystem 118 associated with each rotation angle of the object 114 to build up the scan. The image processor 120 combines the projection images using a CT reconstruction algorithm to create 3D tomographic volume information for the object. The reconstruction algorithm may be analytical, where convolution or frequency domain filtering of the projection data is combined with back projection onto a reconstruction grid. Alternatively, it may be iterative, where techniques from numerical linear algebra or optimization theory are used to solve a discretized version of the projection process, which may include modeling of the physical properties of the imaging system.

The present microscopy system 200 further adds an optical camera 210 such as a video camera that collects image data of the object 114 held in the object holder 112. This camera is typically mounted directly or indirectly to the system base 107 via a mounting system 215, such as a bracket. Typically, optical camera 210 collects the images in the visible portion of the spectrum and/or in the adjacent spectral regions such as the infrared. Usually, the optical camera 210 has a CCD or CMOS image sensor. Also included is a light source 212 that illuminates the object in the spectral regions employed by the optical camera. Preferably, the light source 212 illuminates the object 114 in multiple spectral regions (colors), and the optical camera 210 collects different color images in each of those spectral regions. In addition, the light source preferably selectively illuminates the object in one mode of operation and illuminates the background of the object in another mode of operation.

Figure 2:
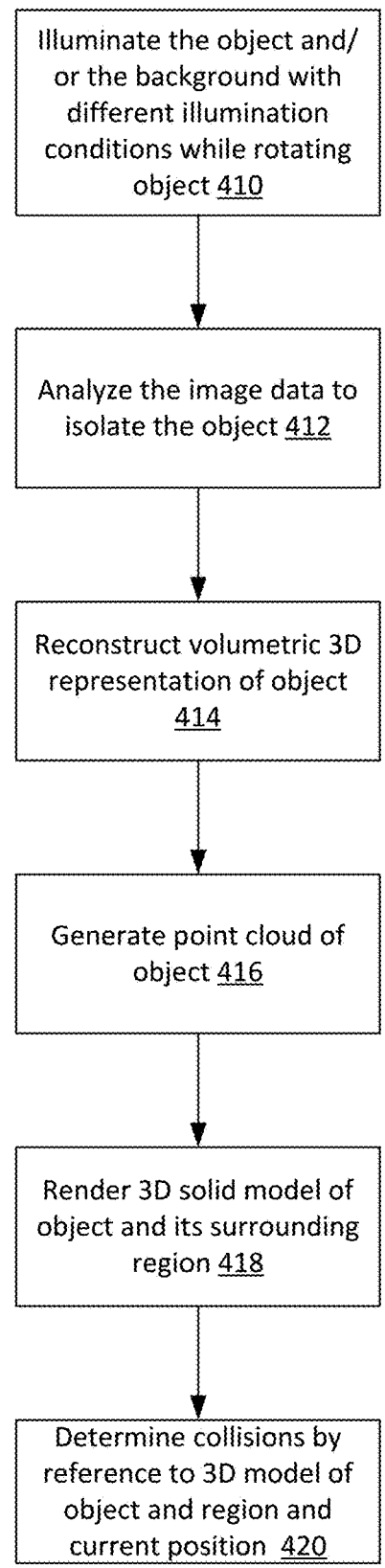
FIG. 2 is a flow diagram showing the operation of the collision avoidance application executing on the computer system of the microscopy system.

Operation:

FIG. 2 shows the procedure performed by a collision avoidance application 230 executing on the computer system 124.

In step 410, the collision avoidance application 230 controls the object stage system 110 of the microscopy system to first rotate the object 114 360 degrees around the y-axis by control of the theta stage 152. To save time, this rotation might be done continuously. While the object 114 turns, the optical camera 210 records a video and/or serial images of the object and this image data is provided to the computer subsystem such as via a USB cable, for example. The image data is stored by the collision avoidance application 230 of the computer subsystem 124. The scan is repeated several times (twice) using different illumination settings (described later) by control of the light source 212.

Figure 3:
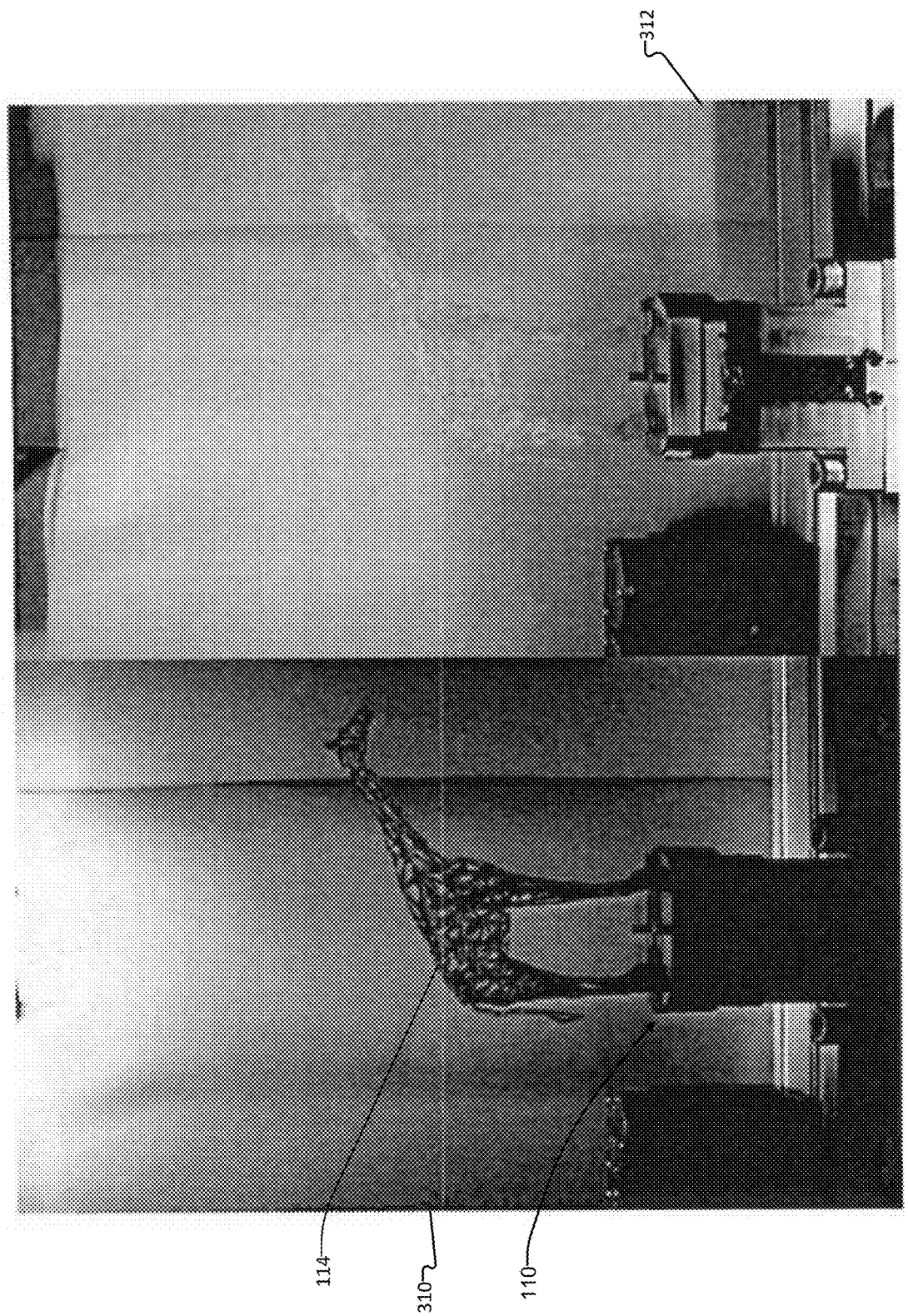
FIGS. 3 and 4 show objects loaded into the microscope under different lighting conditions.

The current implementation uses two separate illumination conditions. See FIG. 3. The idea is to illuminate the object and the background in the first image 310 and only the background in the second image 312 by the collision avoidance application's control of the light source 212.

In step 412 of FIG. 2, the collision avoidance application 230 isolates the object in the image data. In one embodiment, the application analyzes the image data from the two illumination conditions. If the background appears identical in the two images, the collision avoidance application 230 performs a simple image subtraction to isolate the object 114 in the image data.

Figure 4:
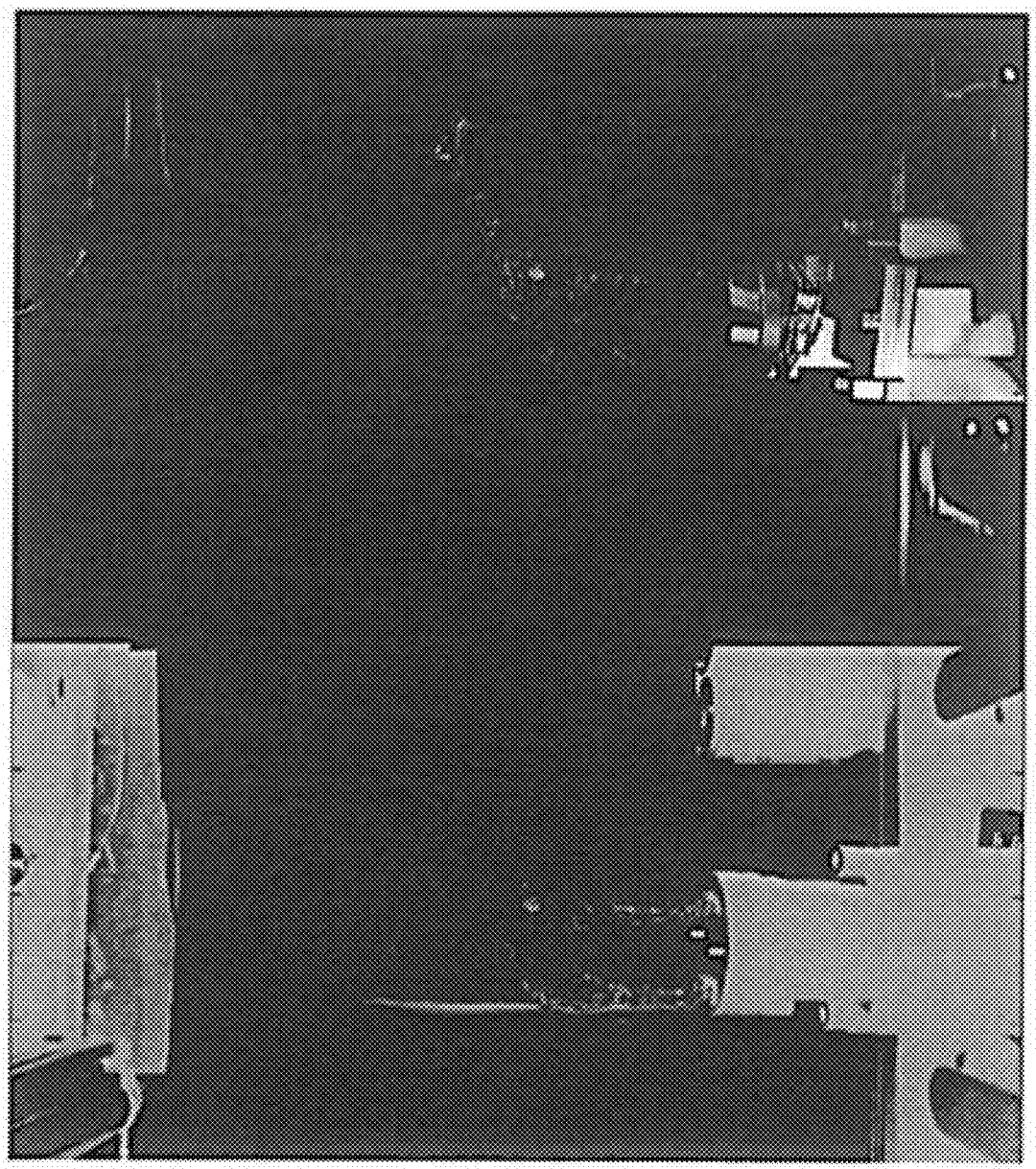

Of course, in practice it is hard to realize perfect lighting conditions to make the background identical. Therefore, in one example, the collision avoidance application 230 executing on the computer subsystem 124 uses a calibration step to match the background intensity of the two illumination conditions. After adjusting for the different background illumination strength, the unmixed image calculated by the collision avoidance application 230 as the difference between the foreground and the background. This calculated image isolates the object 114 and corresponds to a normal reflectance image of the object (in front of a now dark background). A second unmixed image is obtained by the collision avoidance application 230 by inverting the contrast of the transmission image and subtracting the average background intensity (can be estimated from the first unmixed image). This image corresponds to the shadow outline of the object (see FIG. 4). Both images are fused together (mean) for reconstruction and filtered using a tomographic high-pass filter (for example "ram-lak" filter) by the collision avoidance application 230. Alternatively, either one of those images can be used for object reconstruction, e.g. using only the background image corresponds to a shadow carving reconstruction.

In still other examples, the user via the user input device (s) 135, such as a mouse and keyboard, draws bounding boxes surrounding the object at a few angles, a minimum of 2 orthogonal angles is required, to specify the extent of the object 114. This may be used to define an outline of the object or to refine (trim or extend) the constructed 3D outline.

Figure 5:
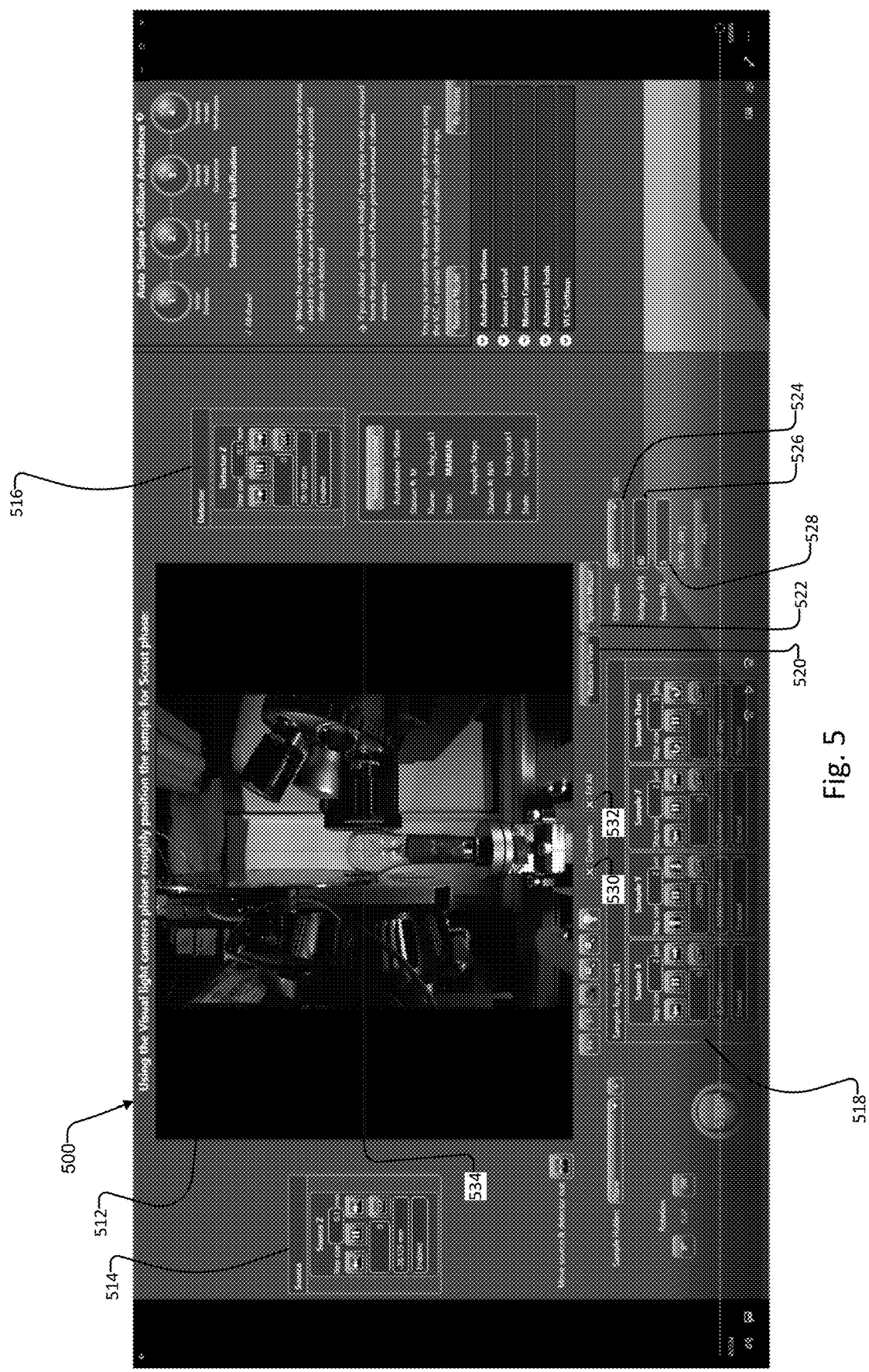
FIGS. 5-10 show a user interface generated by the microscope.

FIG. 5 shows the user interface 500 generated by the collision avoidance application 230 executing on the operating system 162 of the computer system 124 and this user interface rendered on the display device 136. It includes an image region 512 showing the current image data received from the optical camera 210 when the webcam view button 520 is selected, which operates as a radio-button with respect to the system model button 522.

The user interface 500 enables selection of different scanning setup parameters. An objective selector 524 enables dropdown selection of different objectives on a turret of the detector subsystem 118. Also included is a voltage setting 526 and a power setting 528 for the source subsystem 102.

The user interface 500 includes a source position portion 514. The source position portion 514 includes position control buttons for operating the source stage 154 and a step size. It also includes a source position readout showing the current position of the source stage and thus the source subsystem 102.

The user interface 500 includes a detector position portion 516. The detector position portion 516 includes position control buttons for operating the detector stage 156 and a step size. It also includes a detector position readout showing the current position of the detector stage and thus the detector subsystem 118.

The user interface 500 also includes an object position portion 518. It also shows the position of the object by showing the x-axis, y-axis, z-axis positions of the 3-axis sample stage 150. It also shows the object's theta position by displaying the position of the theta stage 152. There are separate position control buttons for operating each axis of the 3-axis sample stage 150 and the theta stage 152 and separate step size settings.

Also shown is the user interface 500 generated by the computer system 124 and displayed on the display device 136 when a crosshairs overlay button 520 is selected, which generates the graphic crosshairs overlay 534 in the image region 512. When Fits All overlay button 532 is selected a graphic box overlay is generated around the object in the image region 512.

Figure 6:
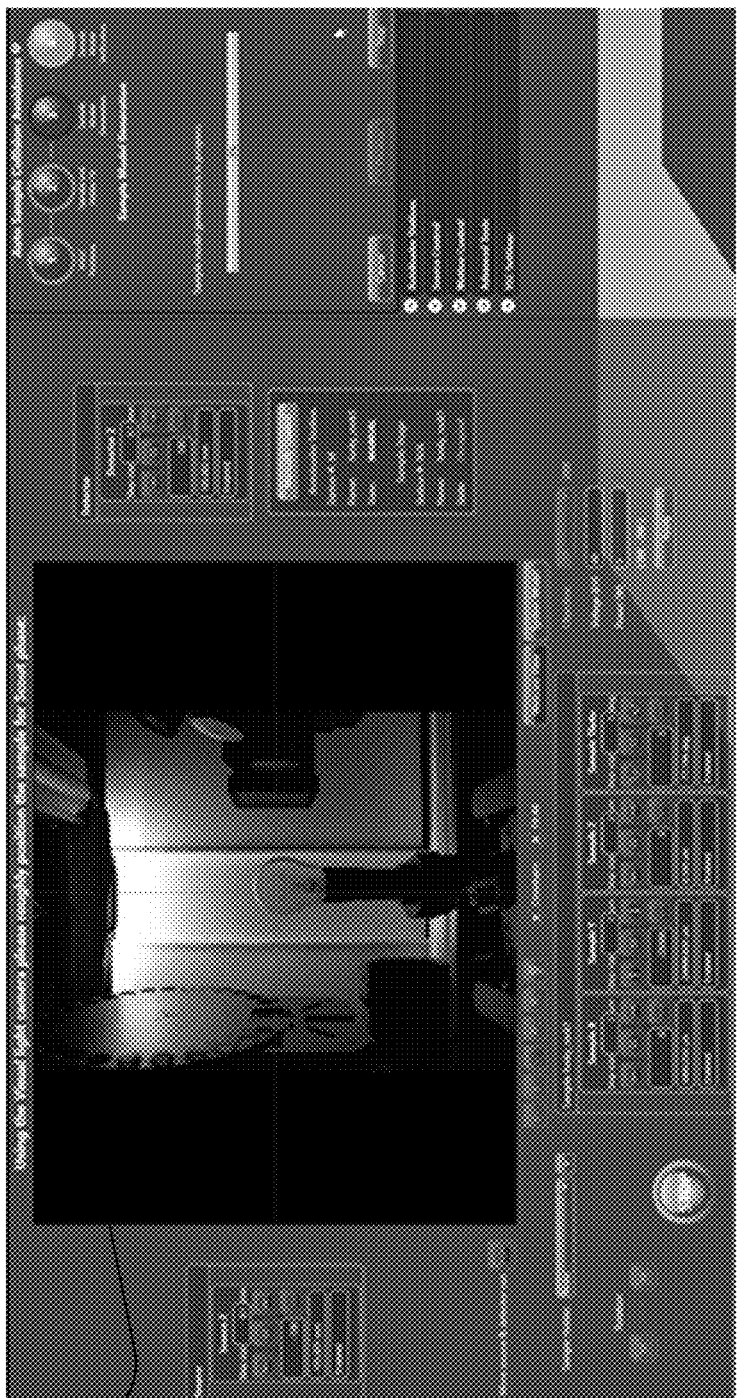

FIG. 6 shows the user interface generated by the computer system 124 and displayed on the display device for the second optical scan of the object under different lighting conditions. Here, the light source 212 is only lighting the background.

Returning to FIG. 2, the video data from the camera 210 is pre-processed by collision avoidance application 230 in step 412. The illumination conditions are unmixed to separate the foreground (the object) and the background (the rest of the camera field of view) by the collision avoidance application 230.

Then in step 414, the image data from the camera 210 is then used by collision avoidance application 230 to reconstruct a volumetric 3D model of the object 114. In one example, the collision avoidance application executes a specially weighted filtered back projection algorithm to reconstruct the object from the image data. Often this 3D model is a shell or boundary. Such models represent the surface, i.e. the boundary of the object, not its volume. That said, in other examples, the model is a solid model that defines the volume of the object, such as one built with constructive solid geometry.

At the same time, the collision avoidance application also contains a 3D system model 235 of the microscopy system 200 and especially the portions of the microscopy system 200 that could collide with the sample 144. Thus, generally the 3D system model 235 includes models of the x-ray source subsystem 102 and the detector subsystem 118. This model could be a shell or boundary that was generated based on the image data from the camera. In other examples, it could be a solid model created as part of the design or manufacture of the system 200.

In addition, the collision avoid application receives the current position 338 of the source stage, current position of the detector stage, the x-axis, y-axis, z-axis positions of the 3-axis sample stage 150, and the position of the theta stage 152.

In addition, the collision avoid application receives the current selected objective for the detector subsystem via the interface 134 when the detector subsystem includes a turret 119 with multiple objectives. This information is important when the different objectives will have different clearances with respect to the object 114.

After the 3D reconstruction into a voxel volume, a point cloud of the object is generated in step 416. Specifically, the object is segmented. The segmentation can be done by thresholding, hysteresis thresholding, principal curves, or machine learning. The volume is then converted into the point-cloud one example.

Then, the collision avoidance application generates a 3D model of the region around the object 114 by combining the point cloud of the object, the 3D system model 235, the current position data 338, and the currently selected objective. The model is then rendered on the display device 136 in step 418 and when the model view button 522 is selected.

Figure 7:
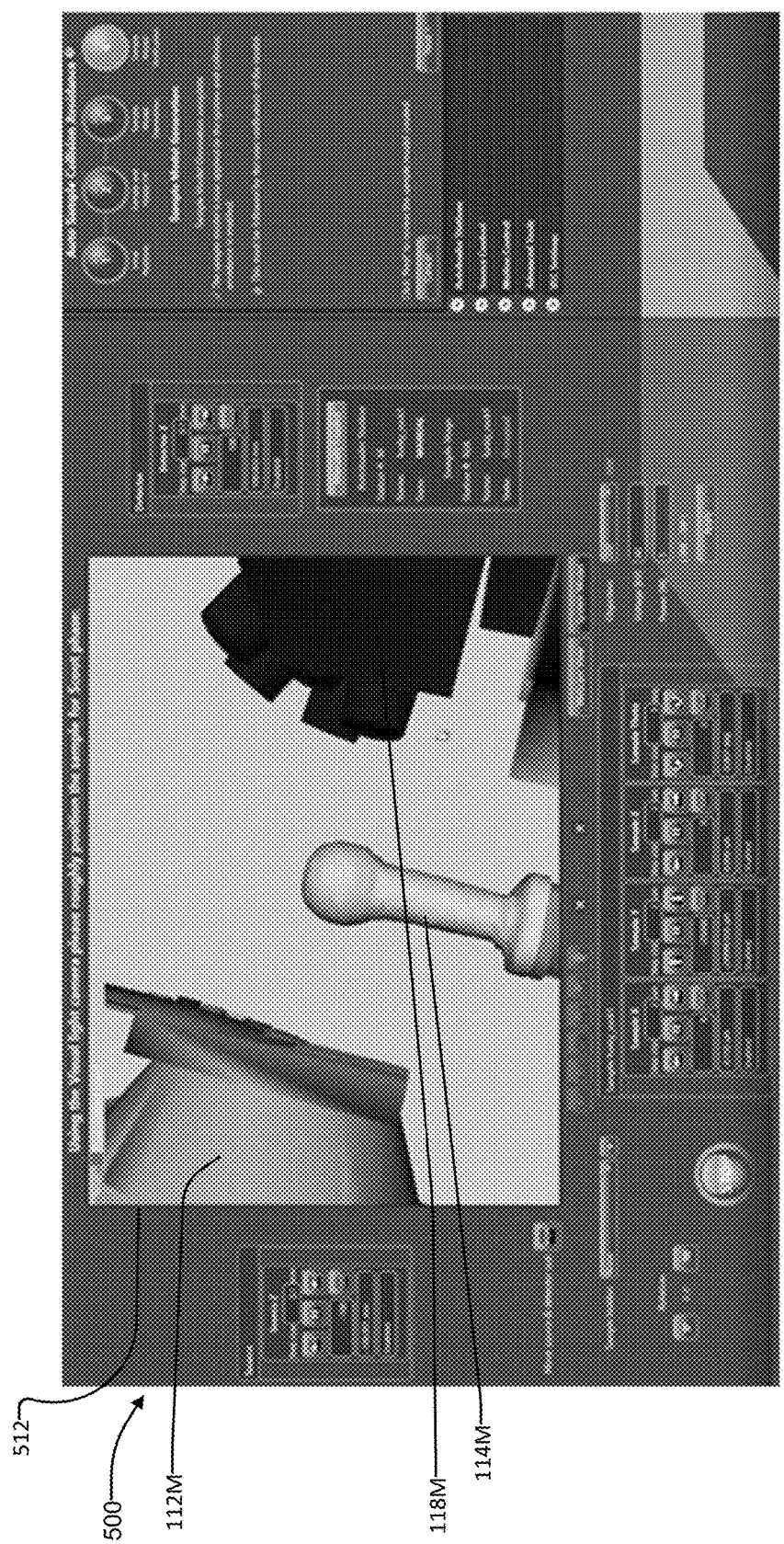

FIG. 7 shows the user interface 500 generated by the computer system 124 and displayed on the display device 136 after the reconstruction of the object. The realtime video image of the object and parts of the system 100 proximate to the object are replaced with the generated 3D solid model. This model includes the 3D rendered point cloud of the object 114M, the rendered source subsystem 112M, and the rendered detector subsystem 118M. The relative positions of the rendered object 114M, the rendered source subsystem 112M, and the rendered detector subsystem 118M are positioned based on the current position data 338 which characterized the scanning setup.

Now the reconstruction of the object and the 3D solid model is employed to configure the microscope for the x-ray scan of the object in step 420.

In one example, collisions are determined by using triangle intersections between models that represent system hardware and the object, Bounding boxes for each component of the model are provided and if those bounding boxes intersect, then each triangle of the models is analyzed, in the case of STL (Standard Triangle Language) formatted models. If the bounding boxes for those triangles intersect, then each triangle is tested for intersection to conclude whether a collision is possible.

In the current embodiment, the user is limited to moving one stage or axis at a time. This movement is then interrupted when a collision is deemed to occur if the movement continued or before it is executed.

There are different occasions when collisions are tested. One of them is ahead of each move commanded by the user. And if there is a collision on that axis, the system moves the axis to the closest non-collided position and informs that user that this is the closest position.

Collisions are also tested ahead of a compounded move, such as during a beam line change on the detector. For example, when the user commands the system to change from an objective mounted on the turret to a macro lens which is a larger field of view lens mounted next to the turret, the system performs a collision test ahead of all the motor activations before allowing the switch.

In addition, the system also tests collisions right before an acquisition, such as during a tomography scan when the object is moved by the X, Y, Z and theta axes. The system tests all of those moves prior to allowing the acquisition to proceed.

Figure 8:
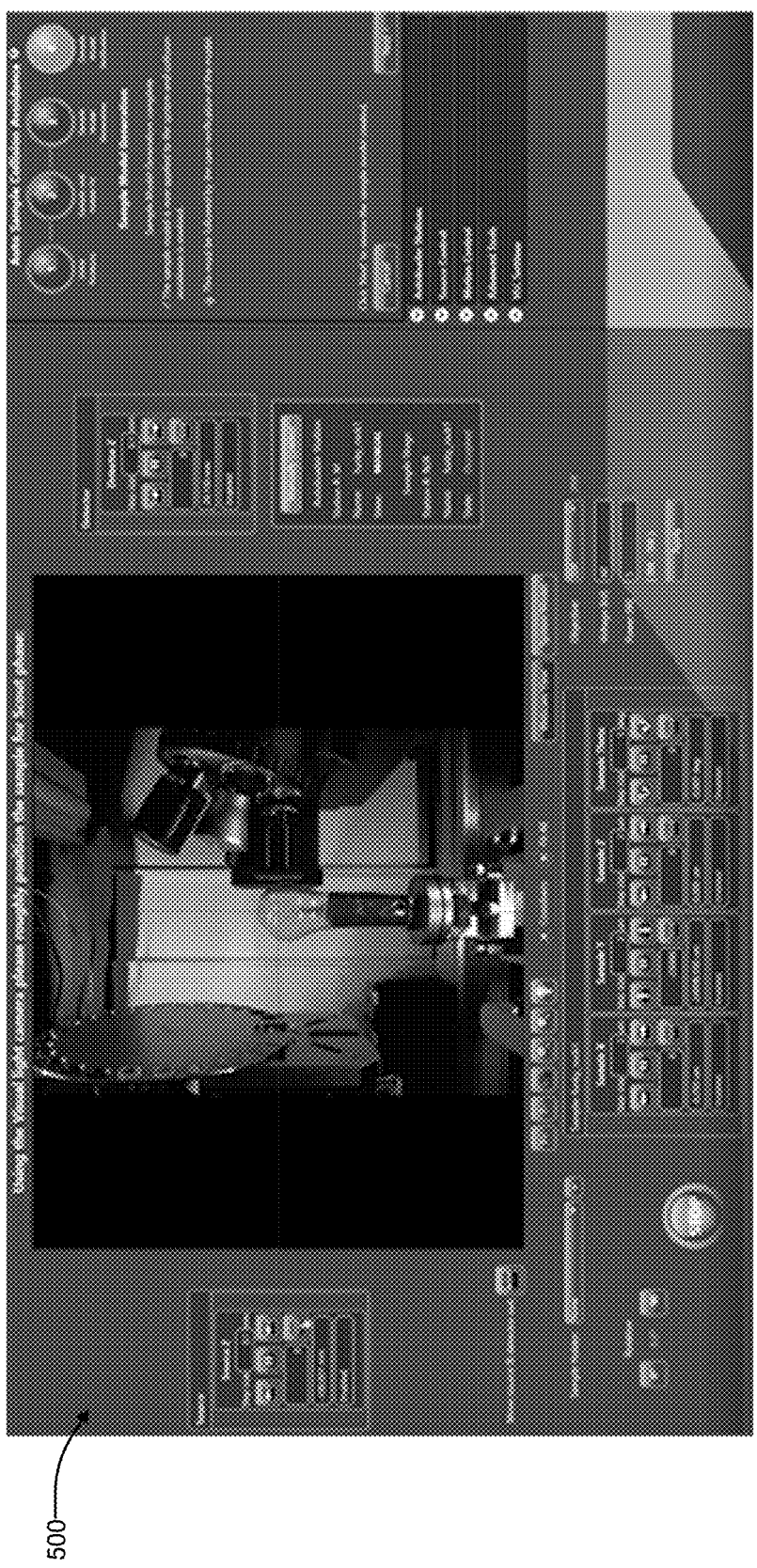
Figure 9:
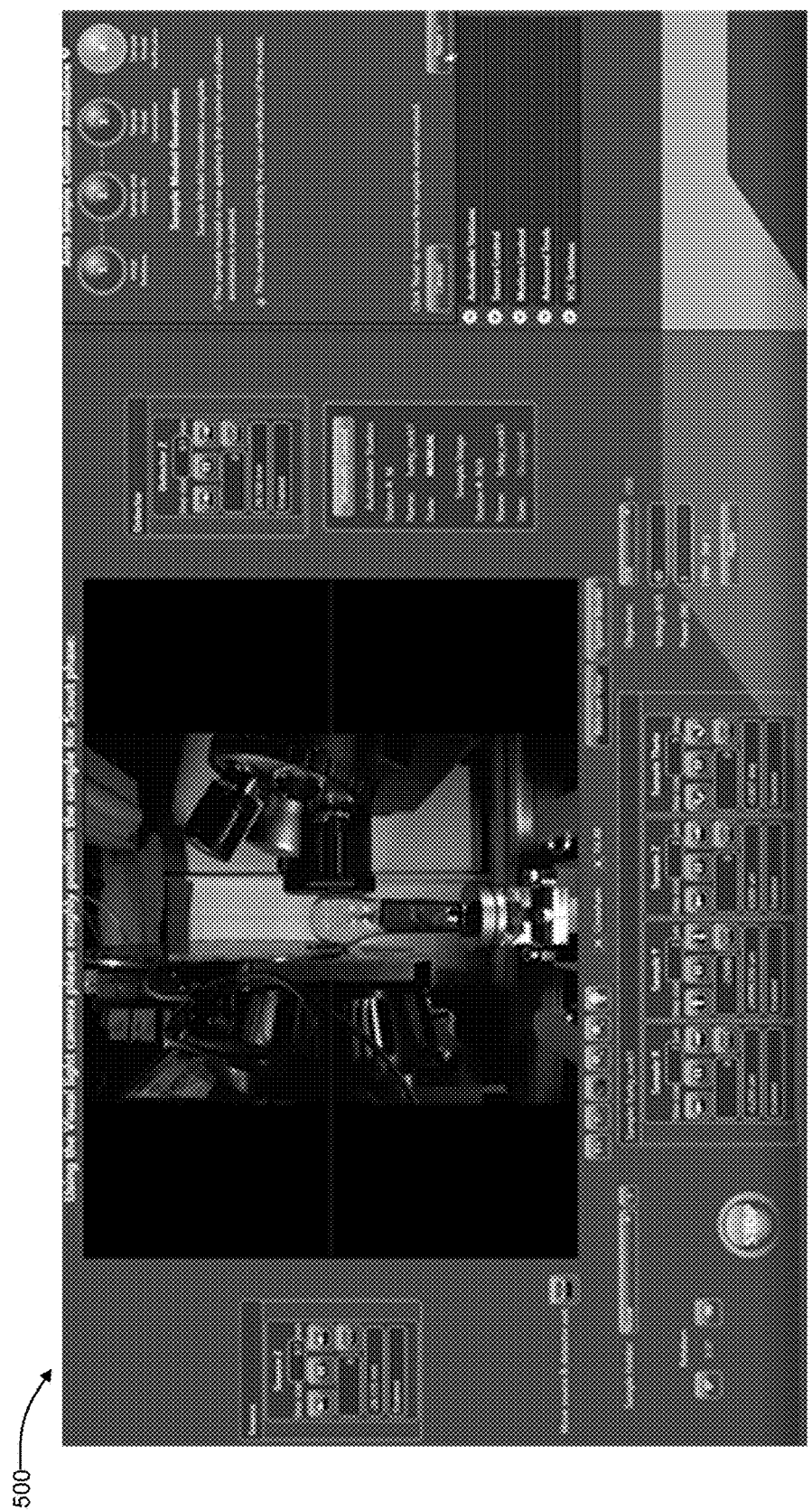
Figure 10:
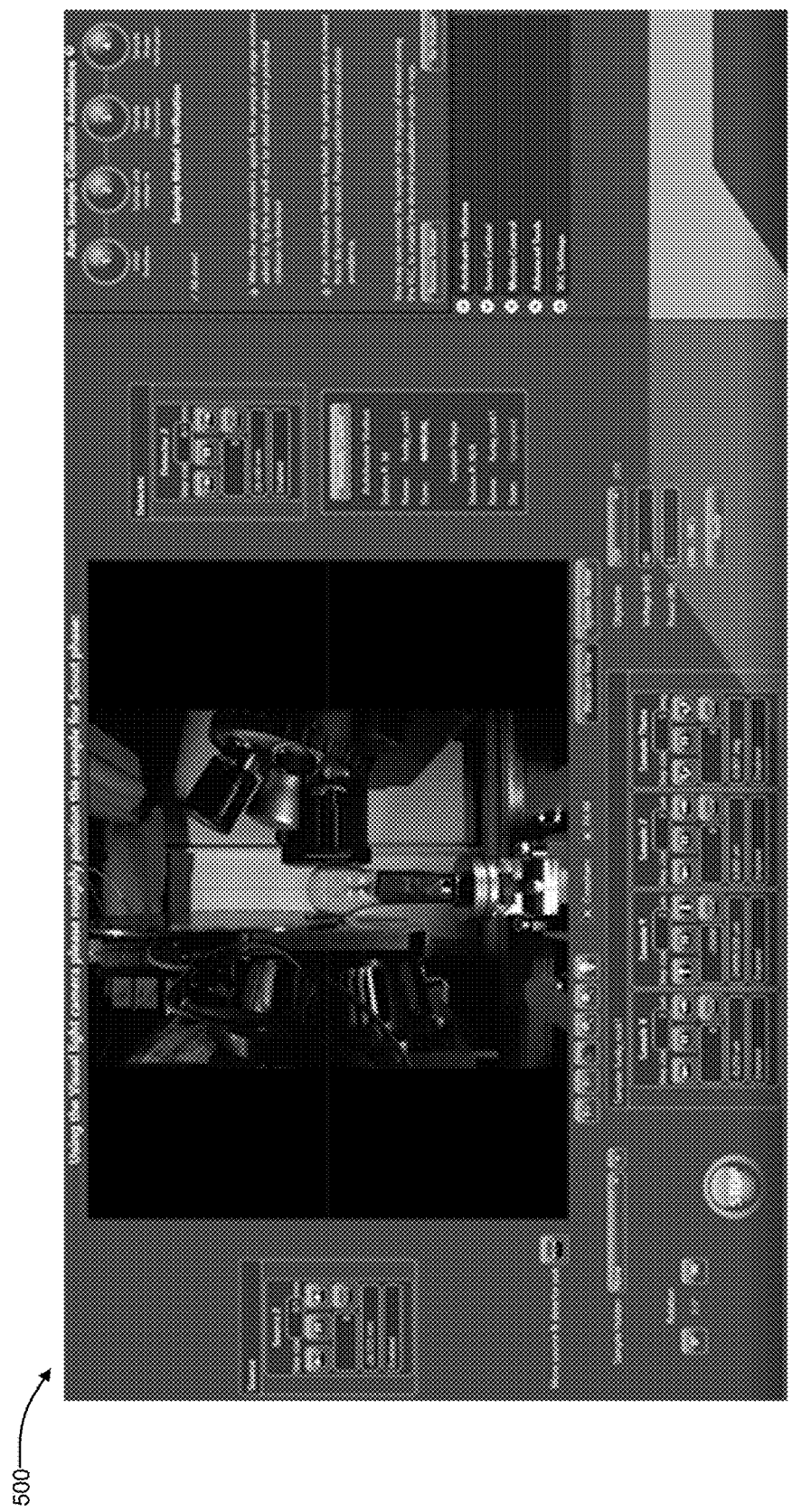

FIGS. 8 and 9 shows the user interface generated by the computer system 124 and displayed on the display device. The reconstruction of the object is employed to move the detector subsystem into position close to the object without colliding with the object as shown in FIG. 8. Then the reconstruction of the object is employed to move the source subsystem into position close to the object without colliding with the object as shown in FIG. 9. The system is ready to execute x-ray scan as shown in FIG. 10.

In addition, with the constructed 3D solid model, optimized scan trajectories (total number of projections and/or number of projections per angle at any particular angle of rotation) are created by the collision avoidance application to reduce subsequent x-ray tomography artifacts (e.g. optimizing HART or deciding if 180+fan allows for a faster scan).

Moreover, the positioning of source subsystem and detector system can be optimized to not only avoid collision but to achieve scans which are the fastest or best resolution or largest field of view.

Finally, the 3D solid model can be employed to visually guide positioning of source and detector during initial hardware setup.

As alternative to meshing, the volume can be used to calculate collisions directly (using a distance transform to the surface of the object).

The 360 degree rotation is required since the computer system 124 needs a full 3D scan of the object. This holds true for other alternative technologies like stripe projection or laser line scanning that could be employed in addition to or as an alternative to the video camera and backprojection reconstruction described above. The continuous rotation reduces the required time for such a scan significantly. The recorded images are composed of a static background and the (rotating) foreground. In order to reconstruct, the computer system 124 should isolate the foreground portion of the image to obtain the object. The present approach uses the images from the different lighting conditions to perform this isolation. Other approaches are possible such as generation of a background model or modeling the microscope's enclosure without the object present.

The reconstruction of the object is a (weighted) filtered back projection in one example. The computer system preferably uses a new form of weighting that is calculated from the constancy of intensity (color could be used as well) assumption that is very often used in optical flow calculations. Additional forms of weighting can be derived from a stereo (multi) camera system in which the weights are from the constancy of intensity between the simultaneous stereo (multicamera) images. Another option is a fringe projection system.

After the FBP reconstruction the 3D volume contains the 3D representation of the object. Now this volume can be used directly to calculate collisions (using a distance transform) or to simulate the X-ray images (by filling the object with a predefined material). Alternatively, the volume is segmented (e.g. by thresholding) and the resulting point cloud is converted into a mesh representation (e.g. by triangulation, alpha shapes or a similar algorithm).

Background subtraction: Background subtraction is an unsolved problem and active field of research. There are quite a few methods in the literature. Closest to our approach are green screen techniques that use color to separate backgrounds. While their performance is good to optimal we would need at least two colors to be able to segment every type of object, and we would still have the problem of a non-uniform background (we can't change the housing (door) of the X-ray microscopes.

Background subtraction records a background image (without the object) and tries to remove (subtract) it from the final images. This has strong limitations depending on other changes in the scene (like illumination or shadows caused by moving parts). The two-illumination procedure proposed offers the following advantages:

Background subtraction: Even with changing backgrounds, we can unmix the images. The quality of this unmixing is mainly driven by the quality of the illumination. A perfectly diffuse illumination that results in the same background appearance gives a perfect unmixing (independent on the objects in the background).

Both the reflectance image and the shadow image are useful for the reconstruction, especially for optically difficult objects:

Object is very dark: In this case the reflectance image does not contain a lot of information (everything is black) but since we have a light background (in most cases) the silhouette of the object is still clearly visible, and the reconstruction at least reduces to the (optical) hull of the object.

Dark background: In some cases, the background might become dark. Then the silhouette image does not work, but unless the object is dark as well, the reflectance image still contains the required information for 3D reconstruction.

Mirrors: Same remarks as dark objects, mostly the reflectance image is affected by specular reflections.

Transparent objects: Depending on their level of transparency the method is able to segment and reconstruct transparent objects. Impossible are objects that become invisible to the camera.

It should be appreciated that the present system and method described above are not limited to a (X-ray) microscope, the scan can be done by a dedicated hardware (which of course allows the inclusion of other methods). One key component that is linked to the X-ray microscope is the fact that all coordinate systems are aligned. This is achieved by using the same calibration object (alignment post) for both the X-ray and the camera system. Such a Calibration object can be a simple sphere that is visible in both systems or a dot-grid which has the same property.

While this invention has been particularly shown and described with references to preferred embodiments thereof, it will be understood by those skilled in the art that various changes in form and details may be made therein without departing from the scope of the invention encompassed by the appended claims.

For example, a further option is to enhance the optical data and the optical reconstruction with x-ray data from the microscope or other primary tomography systems through image fusion or a Kalman type voting. In cases where the optical system results in low confidence, the optical model is enhanced with a coarse CT-scan producing from x-ray projections to create a better model.

What is claimed is:

1. A collision avoidance system for a microscopy system, comprising:
    a camera or multiple cameras for capturing images of an object loaded into the microscopy system;
    a light source for illuminating the object; and
    a computer that controls the light source to illuminate the object using different illumination conditions and processes image data of the object at different angles from the camera and for the different illumination conditions to isolate the object to generate a model of the object, and uses the model to configure the microscopy system for operation.

2. The system as claimed in claim 1, wherein the computer uses the model to avoid collisions between the microscopy system and the object.

3. The system as claimed in claim 1, wherein the microscopy system is an x-ray microscope.

4. The system as claimed in claim 1, wherein the microscopy system is a scanning electron microscope, a focused ion beam system, or an optical microscope.

5. The system as claimed in claim 1, wherein the computer further has a model of a source subsystem and/or a detector subsystem, which are also used to configure the microscopy system.

6. The system as claimed in claim 1, wherein the computer receives current position data of a source subsystem and/or a detector subsystem.

7. The system as claimed in claim 1, wherein the computer renders a display including a model of the object.

8. The system as claimed in claim 1, further comprising a light source for illuminating the object under control of the computer.

9. The system as claimed in claim 8, further comprising the light source illuminating the object in different colors and/or a background of the object.

10. The system as claimed in claim 1, wherein the computer generates and renders a user interface on a display, wherein the user interface includes
    controls for moving a source stage and/or object stages and/or a detector stage; and
    an image region in which a model of an object to be imaged is rendered.

11. The system of claim 10, wherein models of a source subsystem and/or a detector subsystem are also rendered in the image region.

12. The system of claim 10, wherein a user can toggle between a view in which a model is rendered and an actual image is rendered.

13. The system as claimed in claim 1, wherein the computer controls the light source to illuminate the object in one mode of operation and illuminate background of the object in another mode of operation to isolate the object from the background.

14. The system as claimed in claim 13, wherein the computer performs image subtraction to isolate the object images from object illumination and background illumination.

15. The system as claimed in claim 13, wherein the computer controls the light sources to match a background intensity of the two illumination conditions.

16. A collision avoidance method for a microscopy system, comprising:
    capturing image data of an object at different angles and different illumination conditions;
    isolating the object and generating model of the object; and
    using the model to configure the microscopy system for operation.

17. The method as claimed in claim 16, wherein a computer of the microscopy system uses the model to avoid collisions between the microscopy system and the object.

18. The method as claimed in claim 16, wherein the microscopy system is an x-ray microscope.

19. The method as claimed in claim 16, wherein a computer controls the light source to illuminate the object in one mode of operation and illuminate background of the object in another mode of operation to isolate the object from the background.

20. The method as claimed in claim 19, wherein the computer performs image subtraction to isolate the object by controlling the light source to match the background intensity of the two illumination conditions.

* * * * *